Figure 1:
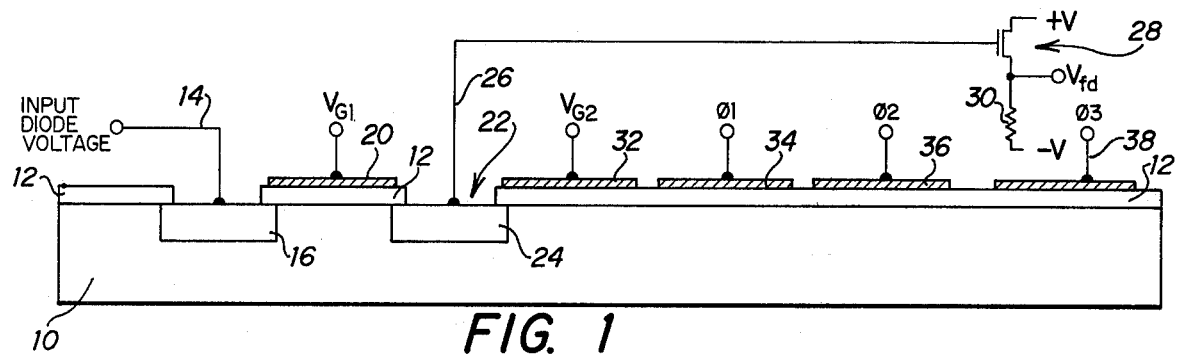

United States Patent [19]
Emmons

[11] 3,965,368
[45] June 22, 1976

[54] TECHNIQUE FOR REDUCTION OF ELECTRICAL INPUT NOISE IN CHARGE COUPLED DEVICES

[75] Inventor: Stephen Perry Emmons, Dallas, Tex.

[73] Assignee: Texas Instruments Incorporated, Dallas, Tex.

[22] Filed: Oct. 24, 1974

[21] Appl. No.: 517,555

[52] U.S. Cl. ............................ 307/221 D; 307/304; 357/24
[51] Int. Cl.$^2$ ................. H03K 3/353; H01L 29/78
[58] Field of Search....... 357/24; 307/221 C, 221 D, 307/304; 328/165

[56] References Cited
UNITED STATES PATENTS

| | | | |
|---|---|---|---|
| 3,755,793 | 8/1973 | Ho et al. | 357/24 |
| 3,758,794 | 9/1973 | Kosonocky | 357/24 |
| 3,814,955 | 6/1974 | Itoh et al. | 357/24 |
| 3,838,438 | 9/1974 | Silversmith et al. | 357/24 |

OTHER PUBLICATIONS
L. G. Heller et al., "Charge Transfer Compensation Circuit," IBM Tech. Disclosure Bull., vol. 16 (3/74) pp. 3164-3165.

H. D. Chai et al., "Noise Compensation for Charge-Coupled Devices," IBM Tech. Disclosure Bull., vol. 16 (9/73) pp. 1099-1100.

*Primary Examiner*—William D. Larkins
*Assistant Examiner*—Gene M. Munson
*Attorney, Agent, or Firm*—Hal Levine; James T. Comfort; Richard L. Donaldson

[57] ABSTRACT

The specification discloses a technique for suppressing the effect of noise generated during the introduction of a charge into a potential well of a charge coupled device. The technique involves detecting the voltage appearing on a floating diffused region during the introduction of the charge through the floating diffused region into the CCD potential well. An error signal is developed from the detected voltage and is subsequently utilized to extract noise from the output electrical signal of the CCD.

13 Claims, 12 Drawing Figures

TECHNIQUE FOR REDUCTION OF ELECTRICAL INPUT NOISE IN CHARGE COUPLED DEVICES

This invention relates to charge coupled devices and in particular relates to a system and method for reducing input noise in charge coupled devices.

Charge coupled devices (CCDs) are commonly used in a variety of applications such as shift registers, optical imagers, and the like. A problem which is common to such charge coupled device applications is to electrically introduce an externally controlled charge into the first potential well of the CCD, without introducing substantial noise or charge uncertainties therein. In many previously developed techniques for introducing charge into the initial stages of a CCD, the mean square value of the resulting charge uncertainty or noise is given by $kTC$, wherein $k$ is Boltzmann's constant, T is the absolute temperature and C is the capacitance associated with the first CCD potential well.

Techniques have been heretofore developed for reducing the charge uncertainty introduced into the first stage of a CCD by utilizing a floating diffused region formed in the CCD substrate near the first potential well. In such techniques, an input charge is first introduced into the floating diffused region and a gate electrode is utilized to transfer the charge from the floating diffused region to the first potential well of the CCD. As no external contact is required for the floating diffused region, the dimensions of the floating diffused regions may be considerably smaller than those of the first CCD potential well, thereby resulting in a relatively small capacitance. The small capacitance thus results in a smaller charge uncertainty. This technique is described in greater detail in patent application Ser. No. 373,568, filed June 25, 1973 and entitled "Use of Floating Diffusion for Low-Noise Electrical Inputs in CCDs", by Stephen P. Emmons and assigned to the present assignee.

Another technique has been heretofore employed for reducing the charge uncertainty of the charge which is transferred from a CCD input node to the first potential well of the CCD. In this technique, a bias potential is applied to deplete the first CCD potential well and a low voltage is applied to the input node, thereby transferring charge into the first potential well. The voltage on the input node is chosen small enough to insure that the amount of charge in the first potential well is greater than that corresponding to any possible value of desired input charge. The voltage coupled to the input node is then switched to a high value, causing the input node and the first potential well to now function as the drain and source, respectively, of a MOSFET. Charge is then withdrawn from the first potential well, causing its surface potential to rise until the MOSFET channel current decreases to a very small value, or "pinches off". Under these circumstances, there is little charge stored under the gate at the time of current decrease, and as a result, little charge uncertainty occurs during the transfer of charge to the first potential well of the CCD. This technique is described in greater detail in patent application Ser. No. 373,567, filed June 25, 1973 and entitled "CCD Input and Node Preset Method", by Dennis D. Buss et al and assigned to the present assignee.

While such previously developed techniques have reduced the amount of charge uncertainty or noise introduced into the first stage of the CCD, problems have still arisen with respect to noise introduction in CCD applications. It is thus the object of the present invention to provide a technique for improving the suppression of noise caused by input charge uncertainty from the output of CCDs.

In accordance with the present invention, a technique is provided for reducing noise in a charge coupled device wherein charge representative of the amplitude of an external electrical signal is introduced to a potential well in the charge coupled device channel. A floating diffused region having a conductivity different from the CCD channel is formed at the input of the CCD. Signal charge is introduced into the floating diffused region which is representative of the amplitude of the external electrical signal. The signal charge is then transferred from the floating diffused region to the CCD potential well, while the voltage level of the floating diffused region is sensed. Circuitry is responsive to the sensed voltage level of the floating diffused region for eliminating the uncertainty of the signal charge introduced to the floating diffused region.

In accordance with another aspect of the invention, a technique is provided for reducing noise in a CCD formed on a doped semiconductor substrate wherein charge representative of the amplitude of an external electrical signal is to be introduced into a CCD potential well and clocked through a CCD channel to appear as an output electrical signal at the CCD output. A floating diffused region is doped to have a conductivity type different from that of the substrate. A preset charge level is established in the floating diffused region. Signal charge is then transferred to the CCD potential well from the floating diffused region, the amount of the signal charge being dependent upon the amount of the preset charge and the amplitude of the external electrical signal. Circuitry senses the voltage of the floating diffused region during the transfer of signal charge. Circuitry eliminates noise from the output electrical signal by reducing the output electrical signal by an amount determined by portions of the sensed voltage of the floating diffused region.

In accordance with a more specific aspect of the invention, a CCD is formed on a doped semiconductor substrate wherein charge representative of the amplitude of an external electrical signal is to be introduced to a potential well and moved through a CCD channel to a CCD output. A thin insulating layer is formed on the surface of the substrate. A region in the substrate is doped to a conductivity type opposite that of the substrate and includes an external ohmic contact to form an input diode. A preset electrode is located on the surface of the insulating layer in the vicinity of the input diode. A floating diffused region is doped to a conductivity type opposite that of the substrate and is located in the vicinity of the preset electrode to form in conjunction with the input diode and preset electrode a first MOSFET. A gate electrode is located on the surface of the insulating layer in the vicinity of the floating diffused region and the CCD potential well and forms in connection with the floating diffused region and the CCD potential well a second MOSFET. Circuitry is provided to sense the voltage level of the floating diffused region. Circuitry is responsive to the sensed voltage level for developing an error signal proportional to the uncertainty of charge stored in the CCD potential well. Circuitry subtracts the error signal from the output signal appearing at the CCD output.

In accordance with yet another aspect of the invention, a method is provided which reduces noise occurring in a CCD output signal resulting from the introduction into a CCD potential well of a charge representative of the amplitude of an external voltage. The method includes establishing the level of the charge in a floating diffused region of the CCD in accordance with the amplitude of the external voltage. A level charge is then established in the CCD potential well in accordance with the level of charge in the floating diffused region. The voltage on the floating diffused region is sensed during the establishing of charge in the region and in the potential well. An error signal is developed in response to portions of the sensed voltage, the error signal being representative of the noise introduced during the introduction of the charge. The CCD output signal is then processed in accordance with the error signal to reduce the noise.

Figure 3:
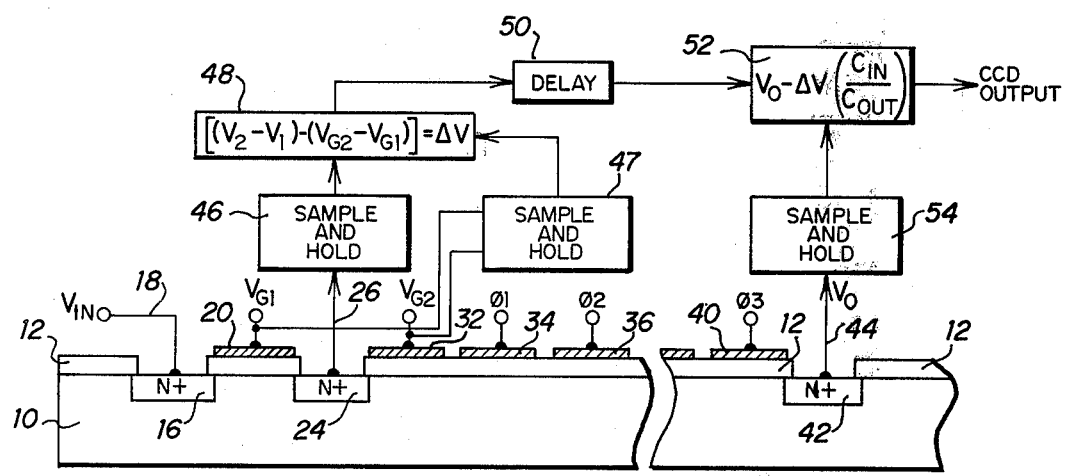
Figure 4:
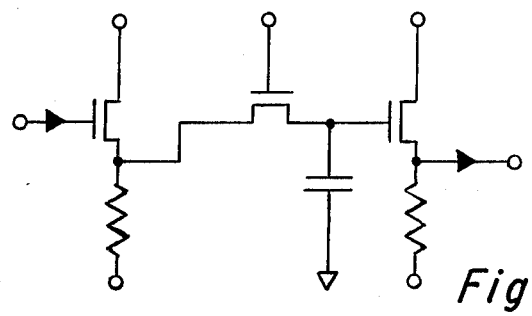
Figure 5:
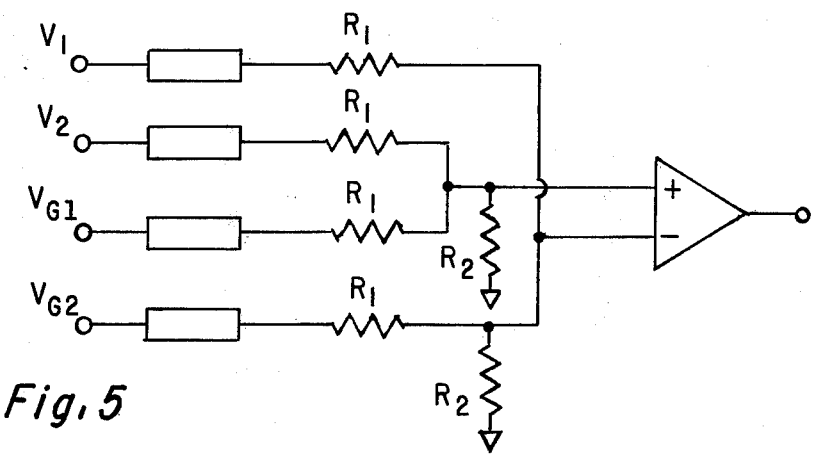
Figure 6:
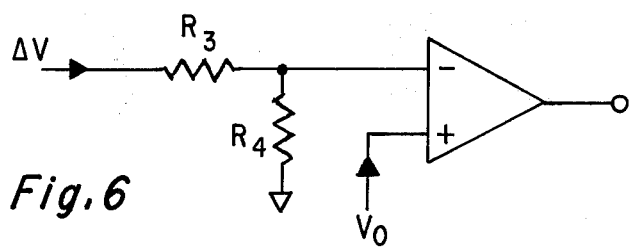

For a more complete understanding of the present invention and for other objects and advantages thereof, reference is now made to the following description taken in conjunction with the accompanying drawings, in which:

FIG. 1 is a somewhat diagrammatic illustration of a CCd input stage constructed in accordance with the invention; CCD FIGS. 2a–2g are waveform representatives of the operation of the input stage of the present invention; and FIG. 3 is a block diagram of a complete CCD noise reduction circuit in accordance with the invention;

FIG. 4 shows a suitable realization for each of the sample and hold circuits 46, 47 and 54 in FIG. 3; and FIGS. 5 and 6 show realization of subtraction circuits 48 and 52 in FIG. 3.

Referring to the drawings, FIG. 1 is a somewhat diagrammatic illustration of a charge coupled device constructed in accordance with the invention. A P-type silicon substrate 10 includes thereon a thin insulating layer 12 which may be comprised, for example, of silicon dioxide. It will of course be readily understood that other substrate materials, dopants and insulating layer materials may be utilized. An opening 14 is formed in the insulating layer 12 in the vicinity of an input diode comprised of an N+ doped region 16 which is formed by conventional diffusion techniques in the substrate 10. An external lead 18 is connected by ohmic contact with the N+ region 16 to form the input diode for connection to an external input source.

A metallic preset electrode 20 is formed over the insulating layer 12 between the input diode 16 and a second opening 22 in the insulating layer 12. A floating diffused region 24 formed of N+ type material is formed in the vicinity of the opening 22. An electrode 26 is connected by an ohmic contact to the floating diffused region 24 and is connected to the gate of a MOSFET 28. A positive bias voltage is connected to the drain of the MOSFET 28, while the source of the MOSFET 28 is connected to provide voltage $V_{fD}$ and is connected through a load register 30 to circuit ground.

A metallic gate electrode 32 is formed on the surface of the insulating layer 12 in the vicinity of the floating diffused region 24 for reception of an external gate voltage in the manner to be subsequently described. Sets of conventional CCD phase electrodes 34, 36 and 38 are formed over insulating layer 12 in order to receive external CCD clock pulses for the purpose of storing and transferring charge along the potential wells in the CCD channel in the conventional manner. While it will be recognized that the CCD illustrated in FIG. 1 constitutes a surface channel device, the invention disclosed herein may also be practiced with a buried channel device. The techniques utilized for fabrication of the CCD illustrated in FIG. 1 are well known in the art and will not therefore be discussed herein in detail.

The waveforms shown in FIGS. 2a–2g are useful in illustrating operation of the device shown in FIG. 1 according to the present invention. The waveform of FIG. 2a illustrates the preset voltage which is applied to electrode 20 and the waveform shown in FIG. 2b is applied to the input diode via electrode 18. The waveform shown in FIG. 2c is the gate voltage applied to electrode 32, while the waveform of FIG. 2d is the voltage $V_{fD}$ which is representative of the voltage appearing on the floating diffusion region 24. Waveforms 2e–2g represent clock pulses applied to the phase electrodes 32–36 in a three phase system. The waveforms shown in FIGS. 2e–2g are connected between zero level and a positive voltage level such as 15 volts with a fifty percent duty cycle, although it is understood that a fifty percent duty cycle is not absolutely necessary for the successful use of the CCD. Relative timing of the clock waveforms shown in FIGS. 2d–2f is well known in the art to provide for shifting the stored charges along the CCD channel.

To input a charge having a value controllable by an external electrical signal into the CCD, early in the interval when the clock pulse shown in FIG. 2e is applied to the phase electrode 34, a voltage pulse $V_{G1}$ (FIG. 2a) is introduced to the preset electrode 20. It will be understood that $V_{G1}$ may alternatively be a DC level upon which an electrical signal may be superimposed. The amplitude of this pulse, shown in the drawings as 8 volts, is representative of the input signal to be introduced to the CCD. As is known, the input signal may be a sample of an analog signal, a digital signal, or a DC level controlling a fat zero and will be biased to insure that it is a positive voltage for surface channel devices formed on a P-type substrate. During the interval when the preset voltage shown in FIG. 2a is applied to the preset electrode 20, the voltage level applied to the gate electrode 32 is zero volts, thereby insuring that the floating diffused region 24 is electrically isolated from the first CCD potential well. Also, during the first portion of the voltage pulse applied to the preset electrode 20, the input of the input diode 16 is at a level low enough to insure excess charge on the floating diffusion.

At the time of the application of the preset voltage pulse shown in FIG. 2a, the combination of the input diode 16, the preset electrode 20 and the floating diffused region 24 comprises a MOSFET with the input diode functioning as the source, the preset electrode as the gate and the floating diffused region as the drain. Under the voltage conditions existing at this time, charge is transferred from the input diode 16 to the floating diffused region 24, thereby drawing the surface potential of the floating diffused region 24, to the low level of input diode 16, as shown in FIG. 2d.

At this point in time, while the voltage pulse (or DC level) is still applied to the preset electrode 20, the voltage on the input diode 16 is switched to a high level, such as 20 volts, as shown in FIG. 2b. The 20 volt level utilized in this instance is illustrative only, it being only necessary that this voltage be greater than the largest positive voltage which might be applied to the preset electrode 20 minus the MOSFET threshold. At this point in the operation of the device, the input diode 16 changes roles, now functioning as a drain of the MOSFET, with the floating diffused region 24 now functioning as a source. Charge is now transferred from the floating diffused region 24 through the CCD channel to the input diode 16, thereby causing the surface potential of the floating diffused region 24 to rise until it reaches a level which differs from the voltage level of the pulse applied to the preset electrode 20 by exactly the threshold potential of the MOSFET.

This rise in the voltage level of the floating diffused region 24 is illustrated in the waveform shown in FIG. 2d as $V_{G1}-V_T$. At this point, the MOSFET is pinched off and since at the instant of pinch-off there was little charge stored under the preset electrode 20, the act of turning off the MOSFET does not give rise to uncertainty in the amount of charge transferred to the floating diffused region. There is, however, uncertainty in the amount of the charge stored in the floating diffused region 24 which stems from Johnson noise associated with the finite channel resistance of the MOSFET. However, as will be subsequently described, the magnitude of this uncertainty in the present invention is of no consequence, as this uncertainty will be subsequently subtracted from the final output of the CCD.

At this point, the preset electrode 20 returns to the zero volt level, as shown in FIG. 2a, thereby locking the charge into the floating diffused region 24. The voltage level of region 24, as shown in FIG. 2d, drops to level $V_1$ due to voltage feed-through. Alternatively, the preset gate voltage may be left unchanged because subsequent steps will tend to pinch-off the first MOSFET even more. Because of the aforementioned isolating effect of $V_{G1}$, the previous steps may be accomplished at any time relative to the application of the waveform shown in FIG. 2e. Subsequently, while the voltage applied to the first CCD phase electrode 34 is at the plus 15 volt level and the second CCD phase electrode 36 is at zero volts, a voltage pulse $V_{G2}$ (FIG. 2c) is applied to the gate electrode 32. This voltage level must be greater than the largest voltage which may be applied to the preset electrode 20 and is illustrated as ten volts in FIG. 2c. Now the gate electrode 32 functions as the gate of a second MOSFET, with the floating diffused region 24 functioning as the source and the first CCD potential well, having a surface potential initially at approximately the 15 volt level, functioning as the drain. Charge flows from the floating diffused region 24 through the channel to the first CCD potential well, thereby causing the surface potential of the floating diffused region 24 to rise until it reaches a point that differs from the potential on the gate electrode 32 by exactly the threshold voltage of the MOSFET. This rise in voltage of the floating diffused region 24 is illustrated in FIG. 2d as $V_{G2}-V_T$. The voltage of region 24 then drops to level $V_2$ when the gate pulse $V_{G2}$ drops back to zero.

An important aspect of the present invention is that the amount of charge which is transferred from the floating diffused region 24 to the first potential well of the CCD is directly related to the difference between the voltage level $V_2$ and the voltage level $V_1$ shown in FIG. 2d. Also, since $V_1$ and $V_2$ are approximated by $V_{G1}$ and $V_{G2}$, and since the amplitude of the pulse applied to the gate electrode 32 will remain constant, it follows that the amount of charge transferred to the first CCD potential well is inversely indicative of the amplitude of the preset voltage $V_{G1}$ applied to electrode 20. Since the turnoff of the second MOSFET has been accomplished through the pinch-off phenomena, the charge uncertainty required with the second transfer is also approximately given by $kTC$, wherein C in this expression is the capacitance of the floating diffused region. However, the magnitude of the capacitance of the floating diffused region 24 is not of great importance with the present invention, inasmuch as the charge uncertainty will be subtracted from the output of the device in the manner to be subsequently described.

It will be understood that the transfer of charge to the first potential well of the CCD shown in FIG 1 may be accomplished according to variations of the technique previously described. Such variations are described in detail in previously described copending patent application Ser. Nos. 373,567 and 373,568.

It will thus be seen that the voltage $V_{fD}$ which is reflected at the output of the MOSFET 28 contains information regarding the amount of charge which has been transferred from the floating diffused region 24 into the first potential well of the CCD. As noted, by subtracting $V_2$ from $V_1$ (FIG. 2d), the instantaneous amount of charge transferred to the CCD may be provided to a level of accuracy limited only by the noise of MOSFET 28, which can be made substantially less than the value of $kTC$. It may then be shown that by subtracting the value $[(V_2-V_1)-(V_{G2}-V_{G1})]C_{IN}/C_{OUT}$, wherein $C_{IN}$ is the input CCD capacitance and $C_{OUT}$ is the CCD output capacitance, from the CCD output, substantially all the degree of uncertainty is removed from the final output signal of the CCD.

Figure 2:
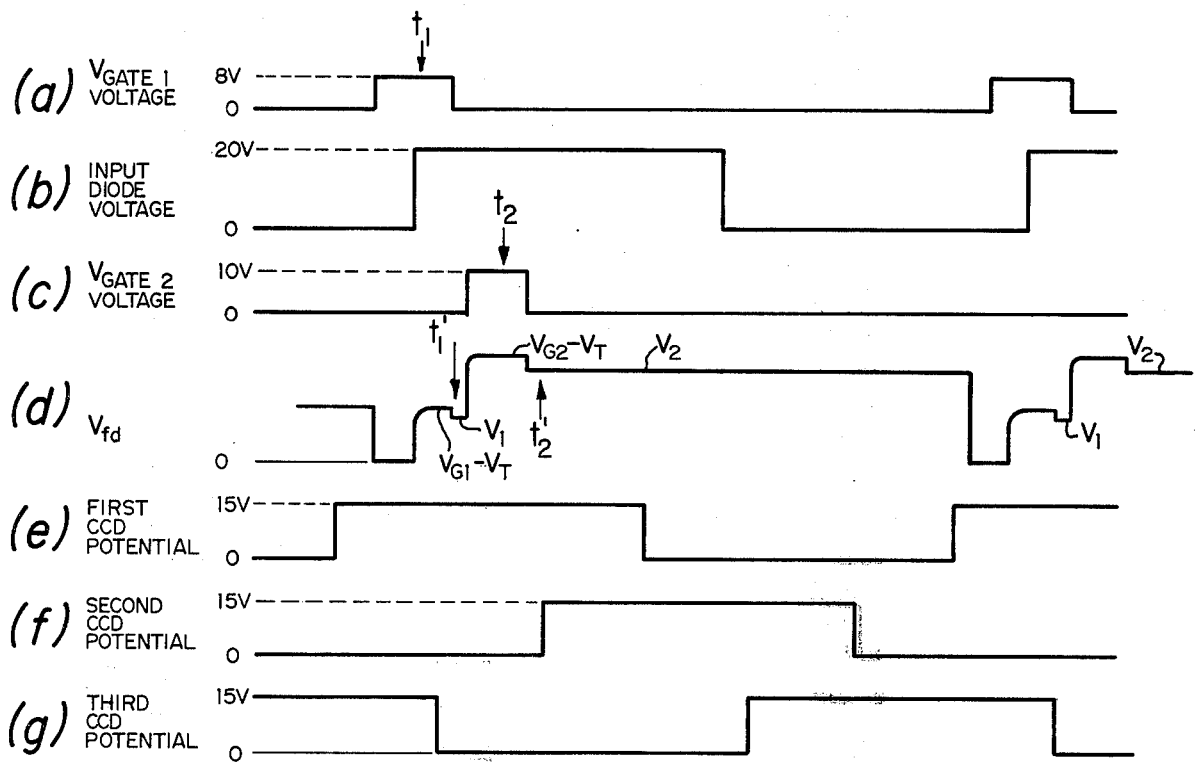

This may be shown as follows. Assume that at any given moment $t_1$ in time, an input signal $V_{G1}$ is present on electrode 20 and it is desired to impress this signal onto the floating region 24 with no statistical uncertainty. But since uncertainty does arise in practice and is a factor of the output signal from the CCD structure, measurement of the actual output signal value is achieved in the following manner. Firstly the input signal $V_{G1}$ is sampled and held at $t_1$ and the floating region voltage $V_1$ is sampled and held as indicated in FIG. 2. The expected value of the difference between the voltages is $V_T$ (the threshold voltage associated with the gate electrode 20) but the actual value is the difference of the sampled voltages $V_{G1}-V_1$. Similarly, at time $t_2$, slightly later than $t_1$, charge is transferred from the floating doped region 24 into the potential well beneath electrode 34 and the voltage of the region 24 changes to level $V_2$. Instead of the expected difference of $V_T$ (threshold voltage associated with electrode 32) the actual difference is $V_{G2}-V_2$. The voltages $V_{G2}$ and $V_2$ also are sampled and held at times $t_2$ and $t'_2$ as shown in FIG. 2. The actual charge injected into the potential well beneath the electrode 34 is $(V_2-V_1)C_{IN}$ whereas the desired injected charge is $(V_{G2}-V_{G1})C_{IN}$. The excess (by sign convention) in the injected charge due to input noise uncertainty is $$\Delta Q = [(V_2-V_1) - (V_{G2}-V_{G1})]C_{IN} = \Delta V C_{IN}$$

This excess injected charge when arriving with propagation delay at the CCD output, will cause a voltage shift on $C_{OUT}$ given by $$\frac{\Delta Q}{C_{OUT}} = \Delta V \cdot \frac{C_{IN}}{C_{OUT}}$$

Thus by subtracting this voltage shift from the overall output signal $V_O$, an output signal free of noise uncertainty factor is obtained at the CCD output.

FIG. 3 illustrates a system for accomplishing this elimination of uncertainty from the output of a CCD. FIG. 3 illustrates a CCD similar to that previously described in FIG. 1, and therefore like numerals will be utilized for like and corresponding parts previously described. Accordingly, charge is initially introduced into the CCD by first applying a preset voltage $V_{G1}$ to electrode 20 and concurrently applying a clock voltage to the phase electrode 34, as shown in FIGS. 2a–2c. An input voltage $V_{IN}$ is applied to the input diode 16 and the pulse applied to electrode 20 is terminated. Subsequently, a pulse $V_{G2}$ (FIG. 2c) is applied to electrode 32 in order to transfer charge from the floating diffused region 24 to the first potential well of the CCD, in the manner previously described. Clock pulses shown in FIGS. 2e–2g are then applied to the phase electrodes 34, 36 and to final phase electrode 40 unitl the charge is clocked through the CCD channel to the output diode comprised of an N+ region 42 formed in substrate 10. The final output electrical signal from the CCD is signal $V_O$ which is taken from an electrode 44 which is ohmically contacted to the output diode 42.

In order to eliminate the noise in the input signal caused by Johnson noise and other sources, the voltage appearing on the floating diffused region 24 is sampled by electrode 26 and is applied to a sample and hold circuit 46. The sample and hold circuit 46 may comprise any suitable conventional circuit such as the MOSFET previously described for detecting the waveform $V_{fD}$ shown in FIG. 2d. Additional conventional sampling circuitry is operable by clock pulses derived from the pulses shown in FIGS. 2a–2g to sample the voltages $V_1$ and $V_2$ appearing in the waveform illustrated in FIG. 2d. For example, voltage $V_1$ will be stored by the sample and hold circuit after the termination of the pulse of the signal $V_{G1}$ shown in FIG. 2a. Voltage $V_2$ is sampled and held by the circuit after the trailing edge of the pulse of the signal $V_{G2}$ shown in FIG. 2c. For example, the sampling and hold circuitry may comprise capacitors to which the signal $V_{fD}$ is applied at suitable sampling times $t'_1, t'_2$ (FIG. 2) determined by the signals $V_{G1}$ and $V_{G2}$, the voltages $V_1$ and $V_2$ being stored upon the capacitors. Thus, a first sample and hold circuit as shown in FIG. 4 may be used to sample the voltage $V_1$ at time $t'_1$ and a second sample and hold circuit as shown in FIG. 4 may be used to sample the voltage $V_2$ at time $t'_2$.

In addition, the voltages $V_{G1}$ and $V_{G2}$ on electrodes 20 and 32 are applied to a sample and hold circuit 47. Thus, the voltage $V_{G1}$ may be sampled by a sample and hold circuit as shown in FIG. 4 at time $t_1$ while the voltage $V_{G2}$ may be sampled by a sample and hold circuit as shown in FIG. 4 at time $t_2$. The outputs of the sample and hold circuits 46 and 47 are applied to a subtraction circuit 48, wherein the subtraction $[(V_2-V_1)-(V_{G2}-V_{G1})]$ is performed. Subtractor circuit 48 may comprise any suitable subtractor circuits. A suitable subtraction circuit is shown in FIG. 5. The resulting voltage $\Delta V$ corresponding to $[(V_2-V_1)-(V_{G2}-V_{G1})]$ is applied to a suitable delay circuit 50 which delays the signal for a time representative of the time required for charge to be clocked completely through the CCD channel defined between the floating diffusion region 24 and the output diode 42. The delay circuit 50 may comprise, for example, a second CCD constructed similarly to the CCD on substrate 10.

The delayed voltage from delay 50 is applied to a suitable logic circuit 52. A suitable logic circuit is shown in FIG. 6 wherein the resistors R3 and R4 have the following relationship, i.e., $$\frac{R4}{R3+R4} = \frac{C_{IN}}{C_{OUT}},$$

the amplifier having an input impedance much greater than R4 in parallel with R3.

The output voltage $V_O$ received from the output diode 42 is also applied to a sample and hold circuit 54 which generates a voltage level representative of $V_O$ to the logic circuit 52. The logic circuit 52 may comprise any suitable circuit such as a programmed memory or the like which performs the function $V_O - \Delta V(C_{IN}/C_{OUT})$, wherein $C_{IN}$ is the capacitance of the floating diffusion node (region 24 plus the attached electrodes) and $C_{OUT}$ is the capacitance of the output diode and associated circuitry. The output from the logic circuit 52 comprises an output voltage representative of the output from the CCD which has eliminated therefrom the uncertainty created by noise caused during the inputting of the original signal to the CCD. Thus, if the present CCD is utilized as an imager, the final voltage $V_O$ is directly representative of the image output, without being distorted by noise from the input signal.

It will be understood that various types of circuitry may be utilized to detect the voltage level appearing at the floating diffused region 24 and to subsequently subtract the information derived therefrom from the final voltage at the output stage of the CCD. Regardless of the circuitry used, it will be seen that the present invention eliminates the requirement of the floating diffused region being made very small so as to produce a small capacitance. Instead of subtracting the voltage information derived from the floating diffused region as illustrated, it will be understood that alternate embodiments of the invention may utilize a comparison of the quantity $V_2-V_1$ with the desired level of the input voltage $V_{IN}$ in order to eliminate the introduction of noise to the CCD.

Whereas the present invention has been described with respect to specific embodiments thereof, it will be understood that various changes and modifications will be suggested to one skilled in the art, and it is intended to encompass such changes and modifications as fall within the scope of the appended claims.

I claim:

1. In a charge coupled device comprising a semiconductor substrate defining a channel and phase electrodes overlying and insulated from a surface of said substrate along said channel, input structure for introducing charge packets into a potential well in said substrate beneath at least one of said phase electrodes under control of input signals applied to said input structure, output structure for deriving output signals from said channel, and means for applying clock voltages to said phase electrodes for propagating said electrical charge packets along said substrate beneath said phase electrodes toward said output structure, said input structure including:

means for defining a floating doped region having conductivity different from that of said channel, means for introducing an input signal charge packet into said floating doped region dependent on the amplitude of an input signal applied to said input structure, said input signal charge packet characterized by noise uncertainty factor KTC wherein k = Boltzman's constant;
T = absolute temperature;
C = capacitance associated with said floating doped region;

gate electrode means overlying and insulated from said substrate and disposed between said floating doped region and said one phase electrode;

means for applying a gating voltage to said gate electrode and a clock voltage to said one phase electrode to transfer a quantity of charge dependent on the magnitude of said input signal from said floating doped region into the potential well under said one phase electrode, said quantity of charge also characterized by said noise uncertainty factor; means for sampling the voltage of said floating doped region after introduction thereto of said input signal charge packet, and for sensing the voltage of said floating doped region subsequent to said transfer of charge into said potential well and for deriving from said sensed voltages an error voltage characteristic of the said noise uncertainty factor $kTC$; and means for utilizing said error voltage to modify an output signal produced by said output structure responsive to said input signal to produce an output signal voltage substantially free from said noise uncertainty factor.

2. The combination of claim 1, wherein said input structure further includes input diode means and a further gate electrode overlying and insulated from said semiconductor substrate disposed between said input diode and said floating doped region, and means for applying input signals to said further gate for transferring an input charge packet from said input diode to said floating doped region dependent on the magnitude of an input signal applied to said further gate electrode.

3. The combination as set forth in claim 2, wherein said output structure includes an output diode in said substrate adjacent a further one of said phase electrodes for receiving output charge packets from said channel, said output diode having a capacitance C' associated therewith, and wherein said means for providing said output signal voltage multiplies said error signal by a factor C/C' and subtracts said multiplied error signal from said output signal produced by said output structure.

4. The combination as set forth in claim 2, further including means for sensing said gating voltage applied to said gate electrode and said input voltage applied to said further gate electrode and for generating therefrom a first difference voltage; means responsive to said sensed voltages of said floating doped region to generate a second difference voltage; and means for differencing said first and second difference voltages to generate said error signal.

5. The combination as set forth in claim 4, wherein said means for sensing said voltages of said floating doped region and of said gate and of said further gate include signal sample and hold circuits.

6. The combination as set forth in claim 1, including means for delaying said error voltage by a delay equal to the propagation delay of said input charge packet between said input and output structures, before utlization thereof to modify said output signal produced by said output structure.

7. A method of reducing noise content in an output signal from output structure of a charge coupled device which comprises a semiconductor substrate defining a channel and having an insulating layer on one surface of said substrate and a plurality of spaced apart phase electrodes disposed on said insulating layer above said channel, and input structure for introducing electrical charges into said charge coupled device for propagation along said channel to said output structure, comprising the steps of introducing into a floating doped region in said substrate adjacent to and spaced from a first one of said phase electrodes, a quantity of electrical charge dependent on the amplitude of an input signal applied to said input structure, said quantity of charge being characterized by noise uncertainty factor $kTC$ wherein k = Boltzman's constant;
T = absolute temperature;
C = capacitance associated with said floating doped region;

sampling the voltage of said floating doped region after introduction of said quantity of charge; applying a gating voltage to a gate electrode located on said insulating layer between said floating doped region and said first phase electrode and a clock voltage to said first phase electrode to transfer a quantity of electrical charge dependent on the amplitude of said input signal from said floating doped region into a potential well beneath said first phase electrode, said electrical charge also being characterized by said noise uncertainty factor; sensing the voltage of said floating doped region following said transfer of electrical charge; utilizing said sensed voltages to generate an error voltage dependent on said noise uncertainty factor, propagating said charge inputted into said potential well along said channel to said output structure to generate an output signal characterized by said noise uncertainty factor, and utilizing said error signal to modify said output signal to reduce said noise uncertainty factor thereof.

8. A method according to claim 7, wherein said error voltage is delayed by a delay equal to the propagation delay of said input charge packet from said input structure to said output structure before utlization thereof to modify said output signal.

9. A method according to claim 7, wherein said input charge packet is introduced into said floating doped region from an input diode in said substrate spaced from said floating doped region by initially applying said input voltage to a preset electrode on said insulating layer between said floating doped region and said input diode with said input diode biased to a first voltage to charge said floating doped region to a predetermined level, and then changing said input diode bias voltage to a second level to discharge said floating doped region by an amount dependent on the amplitude of said input voltage.

10. A method according to claim 9, including the steps of sensing said input voltage applied to said preset electrode and said gating voltage applied to said gate electrode and generating a first different voltage therefrom, generating a second difference voltage from said sensed voltages of said floating doped region, and renerating said error voltage from said difference voltages; and wherein said error voltage is multipled by a factor $C'/C$ and subtracted from said output signal to generate said output signal having reduced noise uncertainty factor, wherein $C'$ is the capacitance associated with an output diode of said output structure from which said output signal is derived.

11. A method according to claim 7, wherein said input signal is an analog voltage sample.

12. A method according to claim 7, wherein said input signal is a digital signal voltage.

13. A method according to claim 7, wherein said input signal is a fat zero voltage.

* * * * *